United States Patent
Bakalski

(10) Patent No.: US 9,627,882 B2
(45) Date of Patent: Apr. 18, 2017

(54) SERIAL CAPACITANCE TUNER

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 14/672,370

(22) Filed: Mar. 30, 2015

(65) Prior Publication Data
US 2016/0294365 A1    Oct. 6, 2016

(51) Int. Cl.
H03H 11/28 (2006.01)
H02H 9/04 (2006.01)
H03H 7/40 (2006.01)

(52) U.S. Cl.
CPC .............. H02H 9/04 (2013.01); H03H 7/40 (2013.01)

(58) Field of Classification Search
CPC ............. H03H 11/28; H03H 7/40; H02H 9/04
USPC .......................................................... 333/32
See application file for complete search history.

(56) References Cited

U.S. PATENT DOCUMENTS

| 8,288,895 B2 * | 10/2012 | Yoon | H03J 3/20 307/109 |
| 2011/0002080 A1 * | 1/2011 | Ranta | H03M 1/1061 361/277 |
| 2012/0248522 A1 | 10/2012 | Goyal et al. | |
| 2013/0021113 A1 * | 1/2013 | Bakalski | H04B 1/18 333/176 |
| 2013/0258535 A1 * | 10/2013 | Kim | H02H 3/20 361/56 |
| 2014/0009248 A1 * | 1/2014 | Granger-Jones | H03J 5/246 333/174 |
| 2014/0035631 A1 * | 2/2014 | Choi | H03K 3/012 327/111 |
| 2014/0104132 A1 | 4/2014 | Bakalski et al. | |

OTHER PUBLICATIONS

Frenzel, Lou. "Back to Basics: Impedance Matching (Part 2)." Mar. 1, 2012. Retrieved from http://electronicdesign.com/communications/back-basics-impedance-matching-part-2.
Fair, Walt, Jr. "Antenna Notes for a Dummy: Restricted Space Antennas." Nov. 25, 2008. Retrieved from http://kb7uzb.weebly.com/uploads/6/3/1/0/6310761/antenna_notes_for_a_dummy.pdf.

* cited by examiner

Primary Examiner — Stephen E Jones
Assistant Examiner — Scott S Outten
(74) Attorney, Agent, or Firm — Eschweiler & Potashnik, LLC

(57) ABSTRACT

An impedance matching network comprises a first signal terminal configured to receive a signal from a source circuit and a second signal terminal configured to provide the signal to a load circuit. The network further comprises a series branch comprising a variable capacitive component between the first signal terminal and the second signal terminal. The variable capacitive component comprises a plurality of capacitive portions connected in series, wherein at least one of the capacitive portions comprises a switching element comprising a stack of series connected transistors. The impedance matching network also comprises a control component configured to control a capacitance of the variable capacitive component by controlling the at least one of the capacitive portions based on a predetermined algorithm.

22 Claims, 6 Drawing Sheets

SERIAL CAPACITANCE TUNER

FIELD

The present disclosure relates to impedance tuning systems and, in particular, to a capacitor tuner for tuning antenna impedance and an associated method.

BACKGROUND

In electrical or electronic systems, maximum power transfer between a source of electrical energy and an electrical load is obtained when the load impedance is equal to the source impedance. Current radio frequency (RF) or high frequency (HF) front end systems, for example, a mobile communication network typically comprise a transceiver, a power amplifier, a harmonic filter, an antenna switch, an antenna matching network and an antenna. The antenna matching network is designed to improve power transfer between the transceiver and the antenna by matching the impedance of the transceiver to the impedance of the antenna's feed line.

With the advancement in mobile communication technology, the frequency spectrum of the mobile communications frequencies is getting wider and wider and also the antenna itself requires different impedance matching settings for different environmental conditions. The impedance matching network therefore has to be selected taking into account the various possible operating frequencies and impedances. Further, the advanced design requirements of the mobile communication systems impose size limitations on the impedance matching network.

BRIEF DESCRIPTION OF THE DRAWINGS

In the following, the disclosure will be further explained and described by means of specific example embodiments with reference to the enclosed drawings.

DETAILED DESCRIPTION

Figure 1:
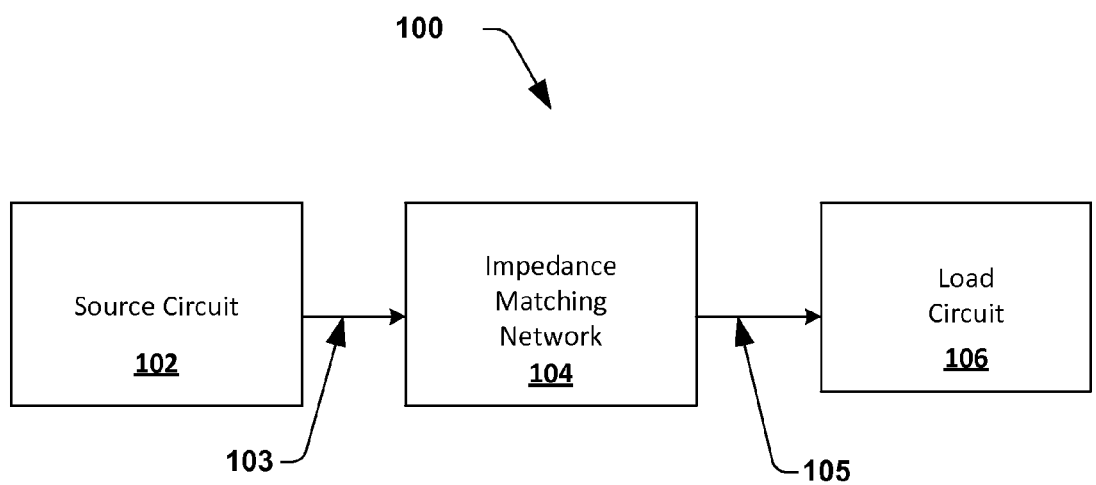
FIG. 1 illustrates a block diagram of a mobile communications network having an impedance matching network according to one embodiment of the disclosure.

In one embodiment of the disclosure, an impedance matching network comprises a first signal terminal configured to receive a signal from a source circuit, a second signal terminal configured to provide the signal to a load circuit and a series branch comprising a variable capacitive component between the first signal terminal and the second signal terminal. The variable capacitive component element comprises a plurality of capacitive portions connected in series, wherein at least one of the capacitive portions comprises a switching element comprising a stack of series connected transistors. The impedance matching network further comprises a control component configured to control a capacitance of the variable capacitive component by controlling the at least one of the capacitive portions comprising the switching element based on a predetermined algorithm.

In another embodiment of the disclosure, a capacitance tuner device comprises a variable capacitive component comprising a plurality of capacitive elements in series. At least one of the plurality of capacitive elements comprises a switch element comprising a stack of series connected transistors and a combination of the off-capacitances of the transistors provide a capacitance of the capacitive element comprising the switch element. The capacitance tuner device further comprises a controller configured to generate an overall capacitance of the variable capacitive component by switching on and off the at least one capacitive element comprising the switch element based on a predetermined algorithm.

In another embodiment of the disclosure, a method for tuning an impedance, comprises determining or estimating a source impedance of a signal source and determining or estimating a sink impedance of a signal sink. The method further comprises adjusting an impedance matching network on the basis of the source impedance and the sink impedance by adjusting a variable capacitive component that is part of the impedance matching network, the variable capacitive component comprising a plurality of capacitive elements connected in series, wherein at least one of the capacitive elements comprise a switch element comprising a stack of series connected transistors.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "element," and the like are intended to refer to a computer-related entity, hardware, software (e.g., in execution), and/or firmware. For example, a component can be a processor, a process running on a processor, a controller, an object, an executable program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In the following description, a plurality of details are set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

This disclosure is directed towards a serial capacitance tuner for tuning an impedance and a method for operating the serial capacitance tuner. In wireless communications systems for the radio frequency (RF), the high-frequency (HF), or other frequency ranges, a so-called front end system may be provided. Such a front end system may be part of a mobile station (e.g., cell phone, smartphone, tablet computer, USB modem) or a base station (e.g., base transceiver station BTS) of a mobile communications network. The front end system may typically comprise a transceiver, a power amplifier, a harmonic filter, an antenna switch, an impedance matching network, and an antenna. The impedance matching network is typically connected between a radio transmitter or receiver and its antenna to improve power transfer between them by matching the impedance of the transceiver to the antenna's feedline. In some implementations, the impedance matching network operates to transform the antenna impedance, thereby matching the antenna impedance to the transceiver impedance. Typically, the RF or HF frontend system may be configured to support several transmit frequencies and/or several mobile communications standards.

As the HF frontend system can be configured to support several frequencies, mobile communications standards, and/or other parameters related to the transmission or reception of radio signals, the impedance matching network may be selected taking into account the various possible use cases, frequencies, and operating modes, as well as their respective probabilities in order to provide a weighted optimum. This task becomes more and more difficult, because the frequency spectrum of the mobile communications frequencies is getting wider and wider, and also the antenna itself requires different impedance matching settings for different environmental conditions.

In order to cover a wide range of possible impedances, adjustable impedance matching networks are typically used. The impedance matching network may be implemented as a basic LC network comprising a series inductance and a tunable capacitance connected in parallel to an output of the impedance matching network. In conventional systems, the tunable capacitance is typically implemented using expensive radio frequency micro electromechanical systems (RF MEMS) capacitors or barium strontium titanate (BST) capacitors or simple RF switches with external components. In one implementation, the tunable capacitance comprises three parallel branches, each branch comprising a capacitor element connected in series with a switch element. The use of external components provides design flexibility, however, it incurs significant loss and also the space requirement is proportional to the amount of used states. To provide a less expensive and lower loss alternative, a serial capacitive tuner comprising a series capacitor topology is introduced in the present disclosure. In some implementations, the serial capacitor tuner comprises a plurality of capacitive portions integrated into a single chip, thereby eliminating the use of external components and reducing the size.

FIG. 1 depicts an example front end system 100, for example, of a mobile communications network, according to the present disclosure, comprising a source circuit 102, load circuit 106 and an impedance matching network 104 between the source circuit 102 and the load circuit 106. The source circuit 102 is configured to provide a signal 103 to be transmitted to the load circuit 106 via the impedance matching network 104. The source circuit 102, for example, can comprise a transceiver, a power amplifier, a harmonic filter and an antenna switch. When functioning in a transmitter operating mode, in one implementation, the transceiver may provide a transmit signal (e.g., signal 103) at its output to the power amplifier. An amplified transmit signal provided by the power amplifier is connected to the harmonic filter, which reduces frequency components of the amplified transmit signal outside an intended transmit frequency range. An output of the harmonic filter is connected to one of the plurality of inputs of the antenna switch. The antenna switch may be configured to connect the inputs to an antenna switch output. The antenna switch output may be connected to an input of the impedance matching network 104.

The impedance matching network 104, for example, can comprise a LC network, configured to transform the impedance of the load circuit 106, in order to match the impedance of the source circuit 102. In one example embodiment, the LC network can comprise a series combination of an inductance and a tunable capacitor. The tunable capacitor can comprise a variable capacitive element comprising a plurality of capacitive elements and the variable capacitive element can be configured to operate in different tunable states, each providing a different capacitor value. For example, in a first tunable state, a first set of capacitive elements are activated to provide a first capacitance value and in a second tunable state, a second set of capacitive elements are activated to provide a second capacitance value, wherein the first capacitance value and the second capacitance value are different from one another. The different tunable states of the variable capacitive element can be configured based on control signals from a controller. One or more of the plurality of capacitive elements in the variable capacitive element can be implemented as switches, each of which can be switched on or off based on the control signals from the controller. Each of the switches can comprise a stack of series connected transistors and the off-capacitance of each of these transistors contributes to the capacitance of the switches. Additionally, in some implementations, capacitance from metal-insulator-metal capacitors (MIM) and/or Metal to Metal capacitors also contributes to the capacitance of the switches. Further, in some implementations, each of the transistors in the stack are designed to have a high transistor width, thus providing low Ron (on-resistance of the transistors) and thereby reducing the loss.

The load circuit 106 can comprise an antenna and is configured to receive a signal 105 to be transmitted from the impedance matching network 104. The load circuit 106 can operate to provide different input impedance values under different environmental conditions. Based on the input impedance of the load circuit 106, the impedance matching network 104 operates to provide an impedance that transforms the input impedance of the load circuit, in order to match the impedance of the source circuit 102. By matching the impedance of the load circuit 106 with the impedance of the source circuit 102, the impedance matching network 104 provides a maximum power transfer between the source circuit 102 and the load circuit 106.

Figure 2:
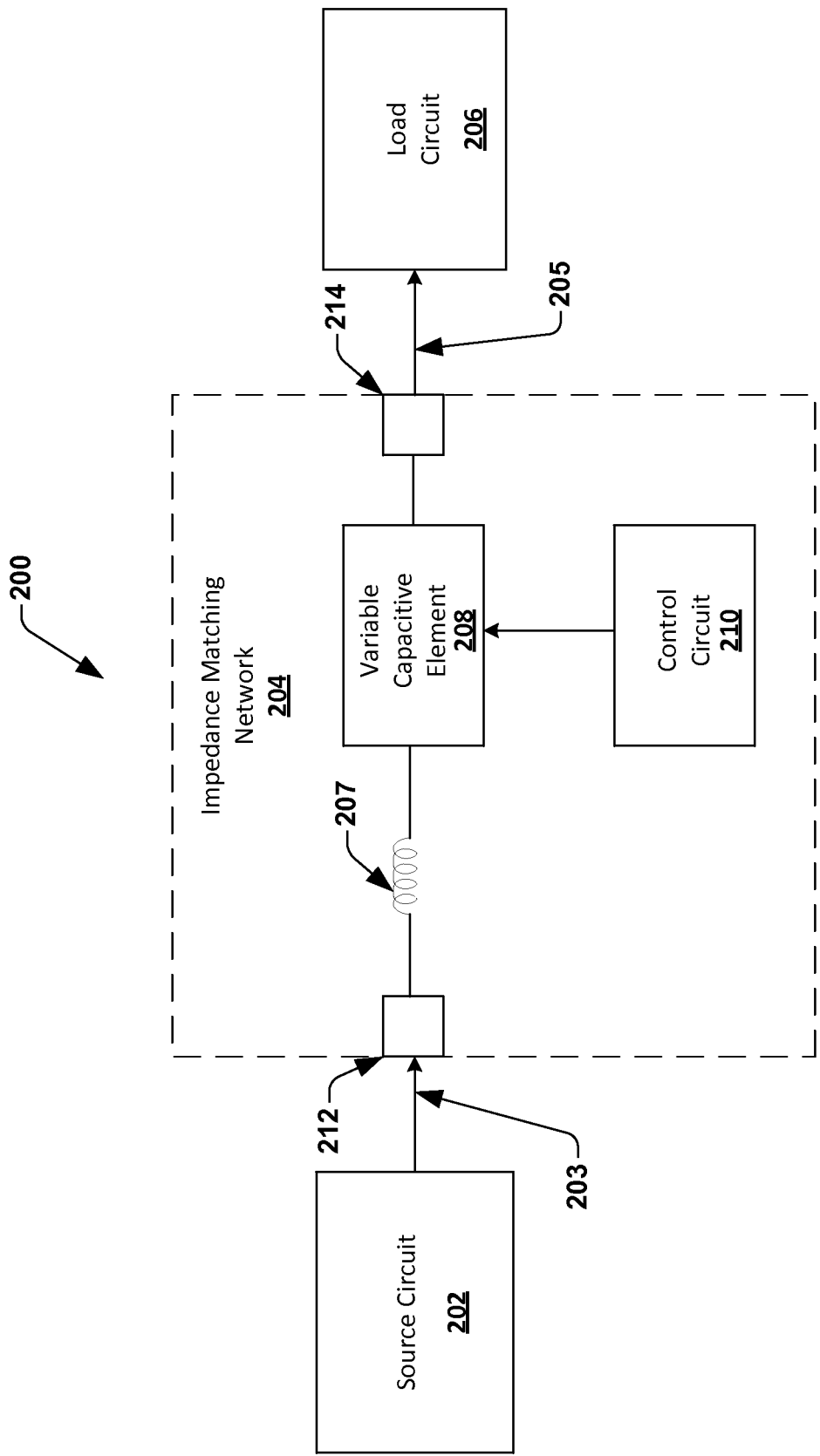
FIG. 2 illustrates another block diagram of a mobile communications network having an impedance matching network, according to another embodiment of the disclosure.

FIG. 2 illustrates another embodiment of a mobile communications network 200, according to the present disclosure. The mobile communications network 200 comprises a source circuit 202, configured to provide a signal 203 to be transmitted to a load circuit 206. The mobile communications network 200 further comprises an impedance matching network 204, configured to transform the impedance of the load circuit 206, in order to match the impedance of the source circuit 202. The impedance matching network 204 comprises a first signal terminal 212 configured to receive the signal 203 from the source circuit 202 and a second signal terminal 214 configured to provide a signal 205 to the load circuit 206. The impedance matching network 204 further comprises a series branch comprising an inductor 207 and a variable capacitive element 208 connecting the first signal terminal 212 and the second signal terminal 214.

In one particular embodiment, the variable capacitive element 208 can comprise a plurality of capacitive portions connected in series. At least one of the capacitive portions may be implemented as a switching element comprising a transistor. In some implementations, the capacitive portions implemented as switching elements can comprise a stack of series connected transistors, and a combination of the off-capacitances of all the series connected transistors in the stack contributes to the capacitance of the capacitive portions. Further, MIM capacitors and/or Metal to Metal capacitances in parallel with the stack of transistors in the switching elements can also contribute to the capacitance of the capacitive portions implemented as switching elements. Additionally, the variable capacitive element 208 can comprise capacitive portions, wherein the capacitance is contributed by MIM capacitance and/or Metal to Metal capacitance alone.

The impedance matching network 204 further comprises a control circuit 210, configured to provide control signals to control the capacitive portions implemented as switching elements. In one embodiment, the capacitive portions implemented as switching elements are switched off and switched on by the control circuit 210 based on a predetermined algorithm, thereby controlling the capacitance of the variable capacitive element 208. The predetermined algorithm can comprise switching the capacitive portions implemented as switching elements in a predetermined direction, in order to avoid voltage overstress. In some implementations, the control circuit 210 comprises a thermometer code decoder. In other implementations, the control circuit 210 can comprise other control algorithms different from the thermometer code.

Figure 3A:
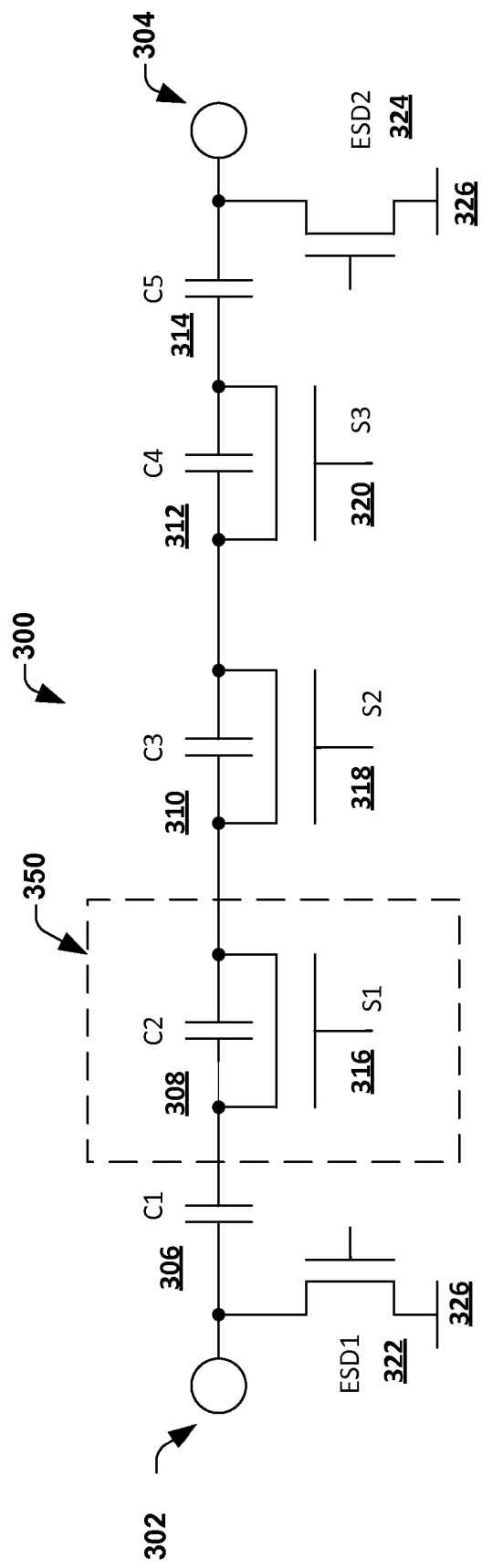
FIG. 3A illustrates a schematic diagram of a variable capacitive element, according to one embodiment of the disclosure.

FIG. 3a illustrates a variable capacitive element 300, according to one embodiment of the disclosure. The variable capacitive element 300 comprises a series branch comprising a plurality of capacitive portions C1 306, C2 308, C3 310, C4 312 and C5 314 between a first signal terminal 302 and a second signal terminal 304. The capacitive portions C2 308, C3 310 and C4 312 comprise switching elements S1 316, S2 318 and S3 320 respectively, and are configured to be switched on or switched off based on control signals from a controller. Each of the first, second and third switching elements S1 316, S2 318 and S3 320 comprise a stack of series connected transistors and they take advantage of the off-capacitance of a transistor, in particular a field effect transistor, even though the off-capacitance $C_{off}$ is typically regarded as a parasitic unwanted phenomenon of field effect transistors. A combination of the off-capacitances of the stack of series connected transistors and MIM capacitance and/or Metal to Metal capacitances contribute to the overall capacitance of the first, second and third switching elements S1 316, S2 318 and S3 320 respectively. In one embodiment, the capacitive portions C2 308, C3 310 and C4 312 are configured to provide equal capacitance values and in other embodiments, the capacitance values can be different.

In one embodiment, the switching elements S1 316, S2 318 and S3 320 are switched in steps of one in a predetermined direction based on the control signals from the controller. For example, in one implementation, the first switching element S1 316 is switched off first, followed by the second switching element S2 318 and then the third switching element S3 320. The number of transistors in the first, second and third switching elements S1 316, S2 318 and S3 320 may be different and is derived based on the anticipated voltage across the switching element at the step in which the respective switching element is switched off. For example, in one embodiment, the number of transistors in S1 316 is greater than the number of transistors in S2 318 and the number of transistors in S2 318 is greater than the number of transistors in S3 320.

Further, the variable capacitive element 300 comprises two capacitive portions C1 306 and C5 314 implemented as MIM capacitors and/or Metal to Metal capacitances that provide fixed capacitance values. The capacitive portions C1 306 and C5 314 can also comprise a plurality of MIM capacitors and/or Metal to Metal capacitors connected in series and the number of MIM capacitors and/or Metal to Metal capacitors in the capacitive portions C1 306 and C5 314 is derived based on the anticipated voltage across the capacitive portions C1 306 and C5 314, when the first, second and third switching elements S1 316, S2 318 and S3 320 are turned on. Additionally, the variable capacitive element 300 comprises a first shunt branch comprising a first electro static discharge (ESD) protection element ESD1 322 between the first signal terminal 302 and a reference potential terminal 326 and a second shunt branch comprising a second electro static discharge (ESD) protection element ESD2 324 between the second signal terminal 304 and the reference potential terminal 326.

Figure 3B:
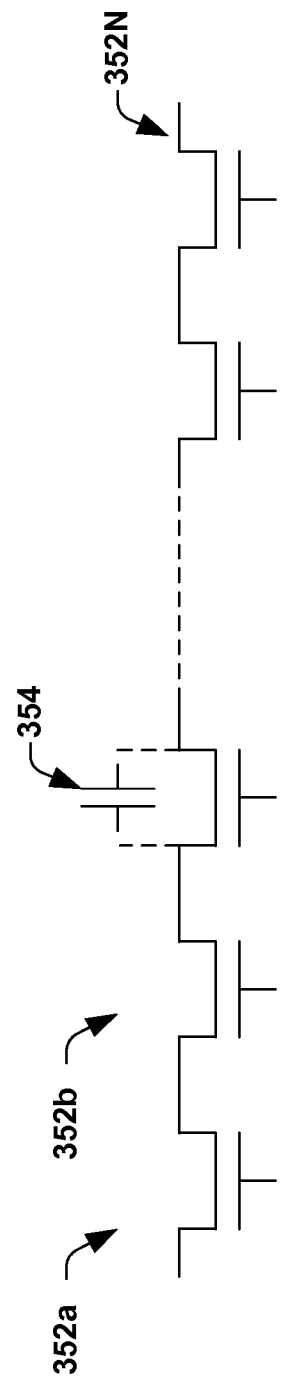
FIG. 3B illustrates a schematic diagram of a switching element comprising a stack of series connected transistors, according to one embodiment of the disclosure.

FIG. 3b illustrates a switching element 350, comprising a stack of series connected transistors. In one embodiment, the switching element 350 can correspond to the switching element S1 316 of FIG. 3a. The switching element 350 comprises a plurality of series connected transistors 352a, 352b up to 352N, where N can be any integer. The number of transistors N is derived based on the anticipated voltage across the switching element 350 at the step in which the respective switching element is switched off. The transistors when turned off, contributes an off-capacitance, for example, 354 and the off-capacitances of each of the series connected transistors, contributes to the capacitance of the switching element 350. In addition, MIM capacitance and/or Metal to Metal capacitance also contribute to the overall capacitance of the switching element 350.

Figure 4:
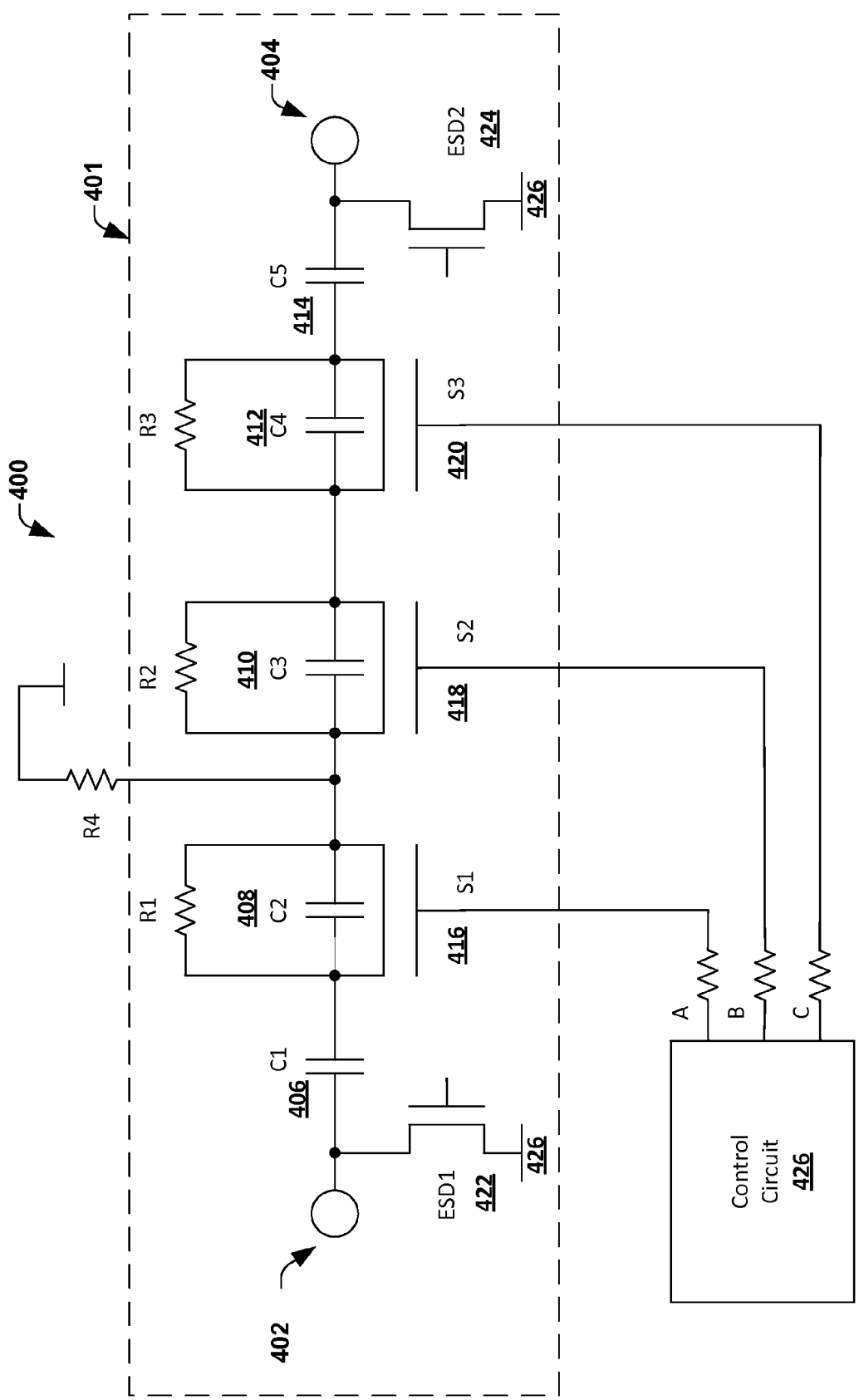
FIG. 4 illustrates a schematic diagram of an impedance matching network having a variable capacitive element, according to one embodiment of the present disclosure.

FIG. 4 illustrates a schematic diagram of an impedance matching network 400, showing some possible implementation details for the variable capacitive element 401. The variable capacitive element 401 comprises a plurality of capacitive portions C1 406, C2 408, C3 410, C4 412 and C5 414 between a first signal terminal 402 and a second signal terminal 404. The first capacitive portion C1 406 and the fifth capacitive portion C5 414 comprise MIM capacitors and/or Metal to Metal capacitors, and the second capacitive portion C2 408, the third capacitive portion C3 410 and the fourth capacitive portion C4 412 comprise switching elements S1 416, S2 418 and S3 420 respectively. The switching elements S1 416, S2 418 and S3 420 respectively comprise a stack of series connected transistors. Each of the switching elements S1 416, S2 418 and S3 420 is controlled by the control circuit 426 configured to provide control signals A, B and C for the corresponding switching elements S1 416, S2 418 and S3 420, for example, based on a predetermined algorithm.

In the embodiment of FIG. 4, four different capacitance values can be obtained by individually making the first switching element S1 416, the second switching element S2 418 and the third switching element S3 420 non-conductive and therefore, the variable capacitive element 401 can operate to provide a 4-step capacitance tuner. A transistor (in particular a field effect transistor) that is in a conductive state can be regarded as a resistor $R_{on}$ wherein $R_{on}$ is the on-resistance of the transistor. In a non-conductive state, the transistor can be regarded as a capacitor with capacitance $C_{on}$ wherein $C_{on}$ is the off-capacitance of the transistor. The control signals A, B and C are configured to switch on or switch off the switching elements S1 416, S2 418 and S3 420 in steps of one in a predetermined direction so as to avoid voltage overstress.

In one example implementation, a uniform capacitance equal to 6 pF is selected to be switched in series, in steps of one based on the control signals A, B and C, thereby implementing a 1.5 pF to 6 pF series capacitor tuner. For this, the switching elements S1 416, S2 418 and S3 420 in FIG. 4 are selected to have a capacitance value of 6 pF each and the MIM capacitors C1 406 and C5 414 are selected to have a capacitance value of 12 pF each. For example, to begin with, let us assume that the first switching element S1 416, the second switching element S2 418 and the third switching element S3 420 are switched on (i.e., conductive). Therefore, in step one, the overall capacitance of the variable capacitive element 401 is equal to 6 pF (from the series combination of MIM capacitors C1 406 (12 pF) and C5 414 (12 pF)). In step two, the first switching element S1 416 is switched off, bringing in a capacitance value of 6 pF in series with the two MIM capacitors C1 406 and C5 414 and therefore the overall capacitance of the variable capacitive element 401 becomes equal to 3 pF. In step three, the second switching element S2 418 is switched off, bringing in a capacitance value of 6 pF in series and therefore the overall capacitance of the variable capacitive element 401 becomes equal to 2 pF. In step four, the third switching element S3 420 is switched off, bringing in a capacitance value of 6 pF in series and therefore the overall capacitance of the variable capacitive element 401 becomes equal to 1.5 pF. Thus, the variable capacitive element 401 operates to provide four different capacitance values (1.5 pF, 2 pF, 3 pF and 6 pF) based on the control signals from the control circuit 426. In other implementations, non-uniform capacitance values can be switched in each step in order to implement the series capacitor tuner. Further, in other implementations, the number of switching elements can be varied, thereby implementing an N-step tuner.

The number of transistors in the stack in each of the switching elements S1 416, S2 418 and S3 420 can be different and in one embodiment, an optimal number of transistors in the stack is derived based on the voltage that is anticipated to appear across the switching elements in the step in which the respective switching element is switched off. In one example implementation, a max voltage rating of the variable capacitive element 401 in FIG. 4 is taken to be 40V, the maximum voltage rating of each of the transistors in the stack is taken to be 1.5V and the maximum voltage rating of the MIM capacitors is taken to be 10V. In step one, for example, when the first switching element S1 416, the second switching element S2 418 and the third switching element S3 420 are switched on, the entire 40V is divided equally among the two MIM capacitors C1 406 and C5 414 (i.e., 20V across C1 406 and 20V across C5 414). Since the maximum voltage rating of the MIM capacitors is taken to be 10V, to withstand 20V, a total of 2 MIM capacitors are stacked together to form C1 406 and C5 414, respectively. In step two, when the first switching element S1 416 is switched off, 20V (i.e., half of 40V) appears across the first switching element S1 416. Since the maximum voltage rating of each of the transistors in the stack is taken to be 1.5V, to withstand 20V, a total of at least 14 transistors need to be stacked together in series to form the first switching element S1 416. Further, in step three, when the second switching element S2 418 is switched off, 13.33V (i.e. one-third of 40V) appears across the second switching element S2 418. Therefore, to withstand 13.33V, a total of at least 9 transistors need to be stacked together in series to form the second switching element S2 418. Furthermore, in step four, when the third switching element S3 420 is switched off, 10V (i.e. one-fourth of 40V) appears across the third switching element S3 420. Therefore, to withstand 10V, a total of at least 7 transistors need to be stacked together in series to form the third switching element S3 420. In other implementations, the number of transistors in the stack can vary based on a number of factors like, the number of switching elements or the number of tunable states used, maximum voltage rating of the device and the voltage rating of the transistors. The control circuit 426 operates to switch the first switching element S1 416, the second switching element S2 418 and the third switching element S3 420 in accordance with the predetermined algorithm (or a predetermined direction), wherein the predetermined algorithm comprises switching off the switching element with the highest number of transistors first in order to withstand the voltage stress. For example, in the variable capacitive element 401 of FIG. 4, the first switching element S1 416 having a stack of at least 14 series-connected transistors is switched off first, followed by the second switching element S2 418 having a stack of at least 9 series-connected transistors and then the third switching element S3 420 having a stack of at least 7 series-connected transistors.

The impedance matching network 400 further comprises two ESD protection elements ESD1 422 and ESD2 424, configured to provide protection against electrostatic discharge (ESD) at both sides i.e., against the surges arriving at the first signal terminal 402 as well as against the surges arriving at the second signal terminal 404. The ESD protection elements ESD1 422 and ESD2 424 conduct a high voltage surge as a moderate electric current towards ground potential at a reference potential terminal 426, thereby protecting the variable capacitive element 401. In some embodiments, the variable capacitive element 401 is implemented as a shunt device, wherein the second signal terminal is grounded. Therefore, in such implementations, the capacitance C5 414 and ESD2 424 can be eliminated and C5 414 can be merged with C1 406 to save chip size.

Further, the variable capacitive element 401 comprises resistors R1, R2 and R3 that operate to define the switch functionality of the switching elements S1 416, S2 418 and S3 420 by keeping their source and drain at equal potential. In some embodiments, each of the resistors R1, R2 and R3 further comprises a plurality of resistors, wherein there is a resistor between the source and the drain of each of the transistors comprising the stack of series connected transistors in the switching elements S1 416, S2 418 and S3 420. In addition, a resistor R4 is provided to set the potential value, which for example, in FIG. 4 is set to ground potential. Usually, resistors R1, R2 and R3 comprise resistance values in the range of 20 k ohm to 100 k ohm and resistor R4 has a high resistance value like 1M ohm. The resistor R4 forces the source-drain potential of the switching elements S1 416, S2 418 and S3 420 to ground, and thereby a positive potential at the gate of the S1/S2/S3 switches turns them on and a negative potential at the gate of the S1/S2/S3 switches turns them off. Further, high resistances are required to enable the device stacking. For example, in RF off switch mode, the off-capacitances force the RF voltage to spread over transistors. Low resistance would cause losses in Q factors and also disturb the voltage distribution on the transistors.

Figure 5:
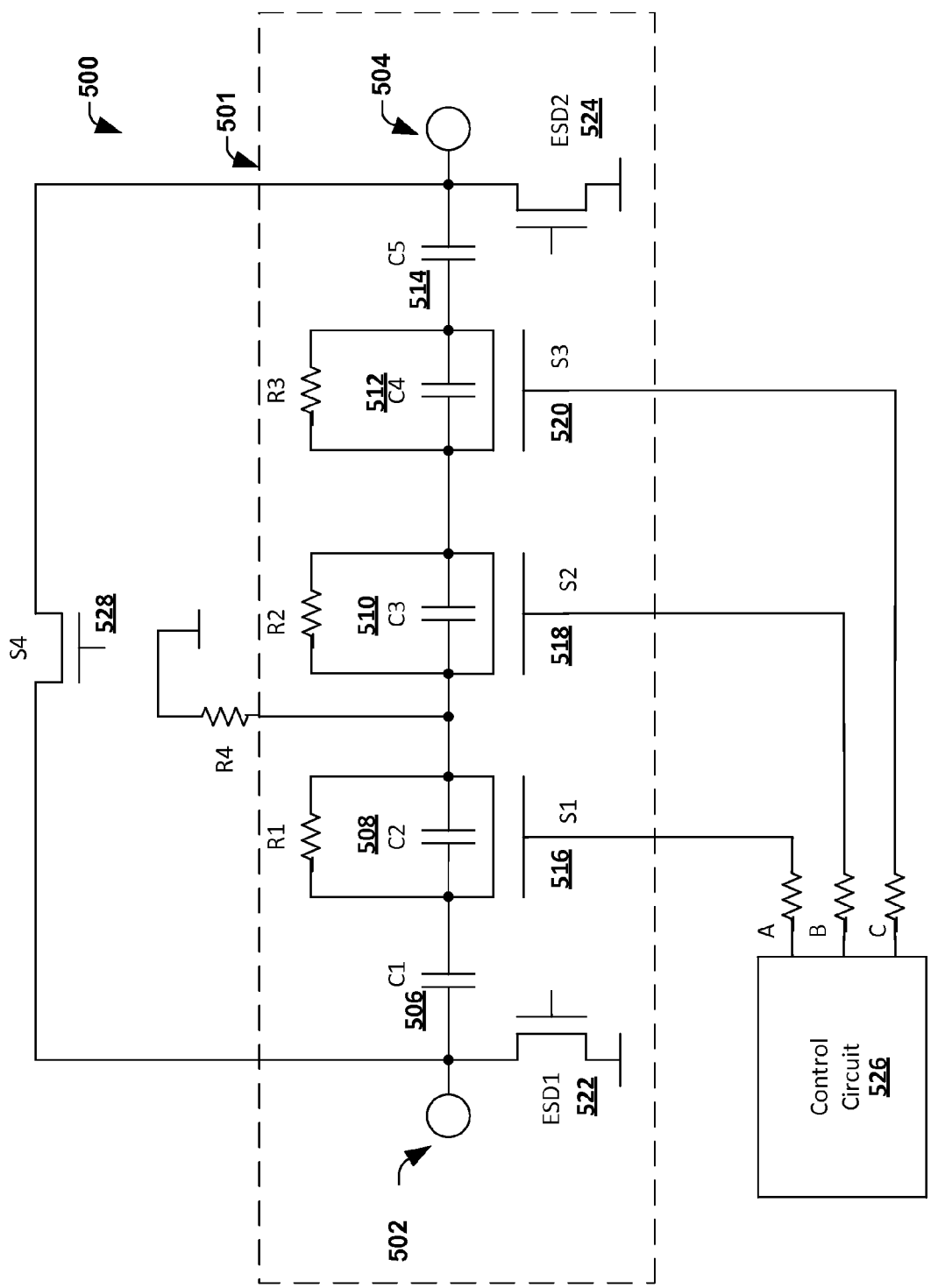
FIG. 5 illustrates schematic diagram of an impedance matching network having a bypass element, according to another embodiment of the present disclosure.

FIG. 5 illustrates the schematic diagram of the impedance matching network 500 according to a further embodiment in which the variable capacitive element 501 is configured to be selectively bypassed by a bypass element. The bypass functionality is provided by a switch element S4 528 comprising a field effect transistor. In some implementations, the switch element S4 528 comprises a stack of series connected transistors. The switch element S4 528 is connected in parallel to the variable capacitive element 501. During normal operation of the impedance matching network 500, the switch element S4 528 is turned off (i.e., non-conductive) and hence, the off-capacitances of the transistors in the switch element 528 can contribute to the overall capacitance of the variable capacitive element 501. During bypass mode, the switch element S4 528 is activated or turned on, which then shorts out the impedance matching network 500.

Figure 6:
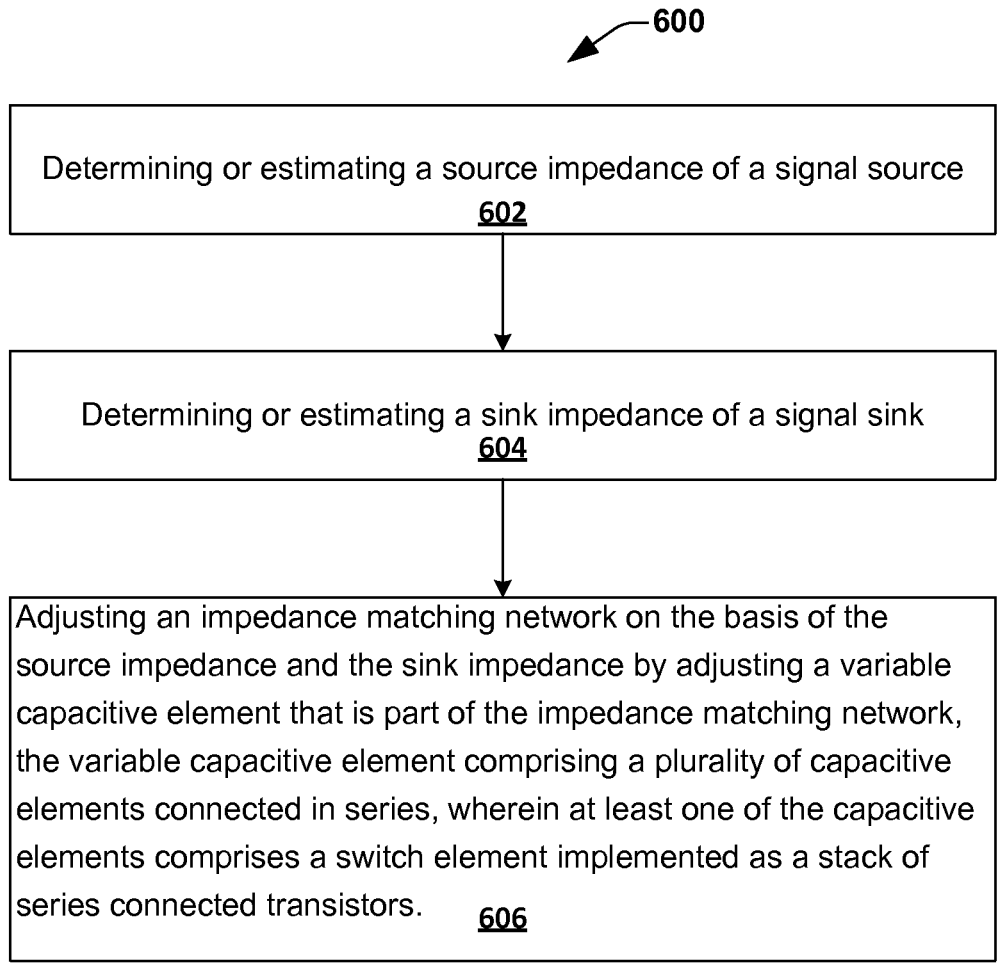
FIG. 6 illustrates a flowchart of a method of tuning an impedance, according to an embodiment of the present disclosure.

FIG. 6 shows a flowchart illustrating a method 600 for tuning an impedance, according to one embodiment of the disclosure. At 602, a source impedance associated with a signal source is determined. At 604, a sink impedance associated with a signal sink is determined. At 606, an impedance matching network is adjusted based on the determined source impedance and the sink impedance, in order to match the sink impedance and the source impedance. Adjusting the impedance matching network at 606 further comprises adjusting a variable capacitive element that is part of the impedance matching network, the variable capacitive element comprising a plurality of capacitive elements connected in series, wherein at least one of the capacitive elements comprises a switch element implemented as a stack of series connected transistors. In some embodiments, the source and the sink impedances are determined using directional couplers that sense forward and reflected power levels. In other embodiments, the source and the sink impedances are determined using a look up table. By checking in the phone using the gyro, the light sensor of the display etc., one can approximate the current "handling" and determine the impedance to be adjusted.

Adjusting the variable capacitive component comprises switching on or off the at least one capacitive component comprising the switching element resulting in the respective capacitive element being connected or not connected to a signal path of the impedance matching network. Further, adjusting the variable capacitive element comprises switching on or off the capacitive elements comprising the switch element in series, in steps of one, in a predetermined direction.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

As highlighted above, the impedance matching network comprising a series capacitor topology has many advantages. The integrated approach using the RF transistor itself as the capacitance contributor, eliminates the use of external RF switches and other discrete components. The elimination of external components lowers the cost of the device and further reduces the chip size. Additional tuning states can be added without greatly increasing the chip size. In addition, higher Q factors can be attained due to the elimination of RF switches. In the series capacitor topology, the switch Ron is not fixed and can be scaled to the used capacitors. For example, Q-factor per step, $$Q = \frac{\text{Im}(Z)}{\text{Re}(Z)} = \frac{\frac{1}{\omega C_N}}{RON, N} = \frac{\frac{1}{2\pi f * C_N}}{\sum_{1}^{N-1} \frac{N_{Tr} * \frac{Ron}{mm}}{W\_N}}$$

where Ron is the total on-resistance of the transistors. In the series capacitor topology, with each further state (i.e. switching off the switching elements in steps of one), Q-factor increases as the total Ron resistance drops dramatically down to almost zero. Furthermore, the use of optimized stacking makes the design suitable for higher RF voltages with low power loss. Additionally, making use of transistors having large transistor width to lower $R_{on}$ also enables to reduce the power loss.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. An impedance matching network, comprising:
a first signal terminal configured to receive a signal from a source circuit;
a second signal terminal configured to provide the signal to a load circuit;
a series branch comprising a variable capacitive component between the first signal terminal and the second signal terminal, the variable capacitive component comprising a plurality of capacitive portions connected in series, wherein at least one of the capacitive portions is a variable capacitive portion comprising a switching element comprising a stack of series connected transistors, wherein a combination of off-capacitances of the series connected transistors provide a capacitance of the variable capacitive portion;
a control component configured to control a capacitance of the variable capacitive component by controlling the at least one variable capacitive portion, based on an impedance of the source circuit and the load circuit, in accordance with a predetermined algorithm, wherein controlling the variable capacitive portion comprises switching on or off the switching element associated with the variable capacitive portion; wherein the at least one variable capacitive portion comprises a first capacitive portion comprising a first switching element comprising a stack of series connected transistors and a second capacitive portion comprising a second switching element comprising a stack of series connected transistors; wherein the first capacitive portion comprising the first switching element and the second capacitive portion comprising the second switching element are connected in series; and the control component is configured to control the variable capacitive portion by switching on or off the first capacitive portion comprising the first switching element and the second capacitive portion comprising the second switching element in series, in steps of one, in a predetermined direction, in accordance with the predetermined algorithm, in order to avoid voltage overstress, wherein the switching on or off of the first capacitive portion and the second capacitive portion comprises switching on or off the first switching element and the second switching element, respectively.

2. The impedance matching network of claim 1, wherein the variable capacitive component further comprises one or more capacitive portions comprising metal-insulator-metal (MIM) capacitors and/or Metal to Metal capacitors.

3. The impedance matching network of claim 2, wherein a voltage across the capacitive portions comprising MIM capacitors and/or Metal to Metal capacitors determines a number of the MIM capacitors and/or Metal to Metal capacitors.

4. The impedance matching network of claim 1, wherein a number of transistors in the first capacitive portion comprising the first switching element is higher than a number of transistors in the second capacitive portion comprising the second switching element.

5. The impedance matching network of claim 4, wherein the predetermined algorithm comprises switching off the first capacitive portion having a higher number of transistors first, followed by switching off the second capacitive portion.

6. The impedance matching network of claim 1, further comprising a bypass switch in parallel to the variable capacitive component configured to short out the variable capacitive component from a signal path between the first signal terminal and the second signal terminal when the bypass switch is switched on.

7. The impedance matching network of claim 6, wherein the bypass switch comprises a stack of series connected transistors.

8. The impedance matching network of claim 1, wherein the variable capacitive portion further comprises MIM capacitance and/or Metal to Metal capacitors connected in parallel to the stack of series connected transistors.

9. The impedance matching network of claim 1, wherein a voltage across the first capacitive portion and the second capacitive portion at the step in which the respective capacitive portion is switched off determines a number of transistors in the respective capacitive portion.

10. The impedance matching network of claim 1, further comprising a reference potential terminal, a first shunt branch between the first signal terminal and the reference potential terminal, comprising a first electro static discharge (ESD) protection element, and a second shunt branch between the second signal terminal and the reference potential terminal, comprising a second electro static discharge (ESD) protection element.

11. The impedance matching network of claim 1, wherein the variable capacitive component is integrated on a single chip.

12. A capacitance tuner device, comprising:
a variable capacitive component comprising a plurality of capacitive portions in series;
wherein at least one of the plurality of capacitive portions is a variable capacitive portion comprising a switching element comprising a stack of series connected transistors;
wherein a combination of off-capacitances of the series connected transistors provide a capacitance of the variable capacitive portion;
a controller configured to generate an overall capacitance of the variable capacitive component by switching on or off the at least one variable capacitive portion, wherein switching on or off the variable capacitive portion comprises switching on or off the switching element associated with the variable capacitive portion; wherein the at least one variable capacitive portion comprises a first capacitive portion comprising a first switching element comprising a stack of series connected transistors and a second capacitive portion comprising a second switching element comprising a stack of series connected transistors; wherein the first capacitive portion and the second capacitive portion are connected in series; and the controller is configured to switch on or off the variable capacitive portion by switching on or off the first capacitive portion and the second capacitive portion in series, in steps of one, in a predetermined direction, in accordance with a predetermined algorithm, in order to avoid voltage overstress, wherein the switching on or off of the first capacitive portion and the second capacitive portion comprises switching on or off the first switching element and the second switching element, respectively.

13. The device of claim 12, wherein a number of transistors in the first capacitive portion comprising the first switching element is higher than a number of transistors in the second capacitive portion comprising the second switching element.

14. The device of claim 13, wherein the predetermined algorithm comprises switching off the first capacitive portion having a higher number of transistors first, followed by switching off the second capacitive portion.

15. The device of claim 12, wherein the switching element further comprises MIM capacitance and/or Metal to Metal capacitance connected in parallel to the stack of series connected transistors and wherein a combination of the off-capacitances of the transistors and metal-insulator-metal capacitance and/or Metal to Metal capacitance provide the capacitance of the switching element.

16. The device of claim 12, wherein the variable capacitive component further comprises one or more capacitive portions implemented as metal-insulator-metal (MIM) capacitors and/or Metal to Metal capacitors.

17. The device of claim 12, wherein the variable capacitive component is configured to generate N different capacitance values based on control signals from the controller, where N is a real number and is greater than or equal to 2.

18. The device of claim 12, wherein a number of capacitance values to be generated by the variable capacitance component, determines a number of the variable capacitive portions in the variable capacitive component.

19. The device of claim 12, wherein a voltage across the first capacitive portion and the second capacitive portion at the step in which the respective capacitive portion is switched off determines a number of transistors in the respective capacitive portion.

20. A method for tuning an impedance, the method comprising:
   determining or estimating a source impedance of a signal source;
   determining or estimating a sink impedance of a signal sink;
   adjusting an impedance matching network based on the source impedance and the sink impedance by adjusting a variable capacitive component that is part of the impedance matching network, the variable capacitive component comprising a plurality of capacitive elements connected in series, wherein at least one of the capacitive elements is a variable capacitive element comprising a switch element comprising a stack of series connected transistors, wherein a combination of off-capacitances of the series connected transistors provide a capacitance of the variable capacitive element; wherein the at least one variable capacitive element comprises a first capacitive portion comprising a first switching element comprising a stack of series connected transistors and a second capacitive portion comprising a second switching element comprising a stack of series connected transistors; wherein the first capacitive portion and the second capacitive portion are connected in series; and a controller is configured to switch on or off the variable capacitive element by switching on or off the first capacitive portion and the second capacitive portion in series, in steps of one, in a predetermined direction, in accordance with a predetermined algorithm, in order to avoid voltage overstress, wherein the switching on or off of the first capacitive portion and the second capacitive portion comprises switching on or off the first switching element and the second switching element, respectively.

21. The method of claim 20, wherein adjusting the variable capacitive component comprises switching on or off the at least one variable capacitive element resulting in the respective capacitive element being connected or not connected to a signal path of the impedance matching network.

22. The method of claim 20, wherein adjusting the variable capacitive component comprises switching on or off one or more variable capacitive elements in series, in steps of one, in a predetermined direction, in accordance with a predetermined algorithm.

* * * * *